United States Patent
Kori et al.

(10) Patent No.: US 10,047,244 B2
(45) Date of Patent: Aug. 14, 2018

(54) METHOD FOR PRODUCING A COMPOSITION FOR FORMING AN ORGANIC FILM

(71) Applicant: SHIN-ETSU CHEMICAL CO., LTD., Tokyo (JP)

(72) Inventors: Daisuke Kori, Jyoetsu (JP); Tsutomu Ogihara, Jyoetsu (JP); Motoaki Iwabuchi, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 286 days.

(21) Appl. No.: 14/804,507

(22) Filed: Jul. 21, 2015

(65) Prior Publication Data

US 2016/0056047 A1 Feb. 25, 2016

(30) Foreign Application Priority Data

Aug. 22, 2014 (JP) .................. 2014-169865

(51) Int. Cl.
| | |
|---|---|
| *C08G 8/20* | (2006.01) |
| *C09D 161/26* | (2006.01) |
| *G03F 7/11* | (2006.01) |
| *C09D 161/12* | (2006.01) |
| *C09D 165/00* | (2006.01) |
| *H01L 21/027* | (2006.01) |
| *H01L 21/311* | (2006.01) |
| *C08G 8/04* | (2006.01) |
| *G03F 7/004* | (2006.01) |
| *G03F 7/039* | (2006.01) |
| *G03F 7/075* | (2006.01) |
| *G03F 7/09* | (2006.01) |
| *G03F 7/20* | (2006.01) |
| *G03F 7/32* | (2006.01) |
| *G03F 7/16* | (2006.01) |

(52) U.S. Cl.
CPC .............. *C09D 161/26* (2013.01); *C08G 8/04* (2013.01); *C08G 8/20* (2013.01); *C09D 161/12* (2013.01); *C09D 165/00* (2013.01); *G03F 7/0046* (2013.01); *G03F 7/0397* (2013.01); *G03F 7/0752* (2013.01); *G03F 7/094* (2013.01); *G03F 7/11* (2013.01); *G03F 7/2041* (2013.01); *G03F 7/325* (2013.01); *H01L 21/0271* (2013.01); *H01L 21/31116* (2013.01); *H01L 21/31138* (2013.01); *C08G 2261/12* (2013.01); *C08G 2261/314* (2013.01); *C08G 2261/3325* (2013.01); *C08G 2261/3424* (2013.01); *C08G 2261/71* (2013.01); *G03F 7/16* (2013.01)

(58) Field of Classification Search
CPC ....................................... C08G 8/20
See application file for complete search history.

(56) References Cited

U.S. PATENT DOCUMENTS

| | | |
|---|---|---|
| 2006/0019195 A1 | 1/2006 | Hatakeyama et al. |
| 2006/0204891 A1 | 9/2006 | Hatakeyama |
| 2007/0122740 A1 | 5/2007 | Hatakeyama et al. |
| 2007/0275325 A1 | 11/2007 | Hatakeyama et al. |
| 2008/0038662 A1 | 2/2008 | Hatakeyama et al. |
| 2011/0311920 A1 | 12/2011 | Kinsho et al. |
| 2012/0064725 A1 | 3/2012 | Kinsho et al. |
| 2012/0184103 A1 | 7/2012 | Ogihara et al. |
| 2012/0252218 A1 | 10/2012 | Kori et al. |
| 2013/0122710 A1 | 5/2013 | Saito et al. |
| 2013/0184404 A1 | 7/2013 | Hatakeyama et al. |
| 2013/0280913 A1 | 10/2013 | Shinjo et al. |

FOREIGN PATENT DOCUMENTS

| | | |
|---|---|---|
| EP | 0251187 A2 | 1/1988 |
| JP | S63-006026 A | 1/1988 |
| JP | S63-126502 A | 5/1988 |
| JP | H06-032814 A | 2/1994 |
| JP | 2004-205685 A | 7/2004 |
| JP | 2004-264710 A | 9/2004 |
| JP | 2005-043471 A | 2/2005 |
| JP | 2005-128509 A | 5/2005 |
| JP | 2005-250434 A | 9/2005 |
| JP | 2005-263264 A | 9/2005 |
| JP | 2006-259249 A | 9/2006 |
| JP | 2006-259482 A | 9/2006 |
| JP | 2006-293298 A | 10/2006 |
| JP | 2007-171895 A | 7/2007 |
| JP | 2007-199653 A | 8/2007 |
| JP | 2007-293294 A | 11/2007 |
| JP | 2007-316282 A | 12/2007 |
| JP | 2008-065303 A | 3/2008 |
| JP | 2008-274250 A | 11/2008 |
| JP | 2009-014816 A | 1/2009 |
| JP | 2010-122656 A | 6/2010 |
| JP | 2012-001687 A | 1/2012 |
| JP | 2012-077295 A | 4/2012 |
| JP | 2012-145897 A | 8/2012 |
| JP | 2012-214720 A | 11/2012 |
| JP | 2014-029435 A | 2/2014 |
| WO | 2010/147155 A1 | 12/2010 |
| WO | 2011/125326 A1 | 10/2011 |
| WO | 2012/077640 A1 | 6/2012 |
| WO | 2012/176767 A1 | 12/2012 |

OTHER PUBLICATIONS

Machine translation of WO 2011/125326 A, published Oct. 13, 2011.*
Mar. 14, 2017 Office Action issued in Japanese Patent Application No. 2014-169865.

* cited by examiner

*Primary Examiner* — Vickey Nerangis
(74) *Attorney, Agent, or Firm* — Oliff PLC

(57) ABSTRACT

The present invention provides a method for producing a composition for forming an organic film, the composition being used in a process of manufacturing a semiconductor apparatus, the method including the steps of (1) washing a compound having an aromatic skeleton by an acid, (2) preparing a composition solution containing the washed compound, (3) filtering the prepared composition solution through a filter, and (4) putting the filtered composition solution into a container made of an organic resin. There can be provided a method for producing a composition for forming an organic film that can form an organic film in which defects after dry etching are reduced.

13 Claims, No Drawings

METHOD FOR PRODUCING A COMPOSITION FOR FORMING AN ORGANIC FILM

BACKGROUND OF THE INVENTION

Field of the Invention

The present invention relates to a method for producing a composition for forming an organic film to be used in fine processing in a process of manufacturing a semiconductor apparatus including a semiconductor device, etc., in particular, a composition for forming a resist under layer film to be used in the multilayer resist method.

Description of the Related Art

The lithography technology used in the manufacture process of a semiconductor apparatus has contributed to the formation of a fine circuit pattern by shortening wavelength of the light source and selecting an appropriate resist composition thereto, and taken the lead in high integration and high speed processing of the semiconductor apparatus.

In order to prevent a pattern collapse when a cutting-edge fine circuit pattern is formed, the aspect ratio of a finished pattern needs to be adjusted appropriately. Therefore, it is necessary to appropriately adjust the thickness of the photoresist film. Currently, in the ArF lithography applied to mass production process, a poly(meth)acrylic resin is used as the photoresist. However, the poly(meth)acrylic resin has a low etching selectivity to a substrate, so that the film thickness of the photoresist formed according to the above requirements decreases the accuracy of pattern transfer to the substrate.

One solution for the above-mentioned problems is a multilayer resist method. In this method, a resist under layer film (e.g., a silicon-containing resist under layer film) having etching selectivity different from that of a photoresist film, i.e., a resist upper layer film, and an organic under layer film are interposed between the resist upper layer film and a substrate to be processed, a pattern is then formed in the resist upper layer film, the pattern is transferred to the silicon-containing resist under layer film by dry etching using the upper layer resist pattern as an etching mask, the pattern is then transferred to the organic under layer film by using the silicon-containing resist under layer film as an etching mask, and further the pattern is transferred to the substrate to be processed by dry etching using the organic under layer film as an etching mask.

The organic under layer film used in the multilayer resist method generally contains metal impurities derived from the raw material. Since the pattern transfer by dry etching is repeated in the multilayer resist method, these metal impurities may serve as an etching mask depending on the dry etching conditions, thereby occasionally transferring an abnormal pattern to the substrate to be processed of the semiconductor apparatus. In other words, when the substrate is processed by dry etching using an organic under layer film containing metal impurities, e.g. silicon, as a mask, the silicon in the organic film serves as a dry etching mask, and thereby column-like defects, so-called "cone defect", are transferred to the substrate. In this case, the semiconductor apparatus shows electrical abnormalities such as open abnormality, short-circuit abnormality, etc., in the circuit, which results in the reduction in yield. Currently, purification of the raw material is considered to be the most effective way to prevent it, and for example, Patent document 1 discloses a method of purifying a raw material polymer by bringing it into contact with an acidic aqueous solution. Conventionally, however, various compositions for forming a film used in the semiconductor apparatus manufacture process are put into a container made of glass and connected to the manufacturing apparatus in almost cases. A small amount of elution from the container made of glass increases silicon content in the composition, which may cause defects occurring after dry etching. Thus, the method as disclosed in Patent document 1 is unsatisfactory to remove the defects occurring after dry etching.

PRIOR ART DOCUMENT

Patent Document

[Patent Document 1] WO 2011/125326

SUMMARY OF THE INVENTION

The present invention has been accomplished to solve the above-described problems, and an object thereof is to provide a method for producing a composition for forming an organic film that can form an organic film in which defects after dry etching are reduced.

To achieve this object, the present invention provides a method for producing a composition for forming an organic film, the composition being used in a process of manufacturing a semiconductor apparatus, the method comprising the steps of:

(1) washing a compound having an aromatic skeleton by an acid;

(2) preparing a composition solution containing the washed compound;

(3) filtering the prepared composition solution through a filter; and (4) putting the filtered composition solution into a container made of an organic resin.

Such a producing method enables a composition for forming an organic layer that can form an organic layer in which defects after dry etching are reduced to be produced.

The aromatic skeleton is preferably any of benzene, fluorene, carbazole, naphthalene, and anthracene.

The compound having such an aromatic skeleton is suitably used for the method for producing a composition for forming an organic film of the present invention.

The compound having the aromatic skeleton is preferably obtained by polymerization of at least a phenol derivative or a naphthol derivative.

Also, the compound having the aromatic skeleton is preferably obtained by polymerization of a phenol derivative or a naphthol derivative and an aldehyde derivative.

The compound having the aromatic skeleton as mentioned above is suitably used for the method for producing a composition for forming an organic film of the present invention.

At this time, a content of silicon atoms in the washed compound is preferably 100 ppb or less.

If the content of silicon atoms is 100 ppb or less, defects after dry etching can be further reduced.

Also, a content of iron atoms in the washed compound is preferably 1 ppb or less.

If the content of iron atoms is 1 ppb or less, the defects after dry etching can be almost eliminated.

Also, it is preferred that the step of washing include washing with an acid solution containing a halogen acid (hydrohalic acid) one or more times, and washing with an acid solution containing nitric acid one or more times.

By washing in this manner, metal impurities can be more effectively removed.

Also, it is preferred that the step of washing include washing with a mixed acid solution containing a halogen acid and nitric acid one or more times.

By washing in this manner, metal impurities can be more effectively removed.

The halogen acid is preferably hydrofluoric acid or hydrochloric acid.

The washing using such a halogen acid can effectively remove silicon, in particular.

A base material of the filter preferably comprises one or more material selected from nylon, polyethylene, polypropylene, polystyrene, and a fluorine resin.

Use of the filter comprised of the above-mentioned base material enables silicon and iron to be effectively removed.

As mentioned above, the method for producing a composition for forming an organic film of the present invention can effectively remove metal components, particularly silicon and iron, in an aromatic compound by washing the aromatic compound by an acid. In addition, when the aromatic compound is washed by using hydrofluoric acid, hydrochloric acid, nitric acid, a mixture of hydrofluoric acid and nitric acid, or a mixture of hydrochloric acid and nitric acid, in appropriate combination, the metal components can be more effectively removed. Moreover, in the present invention, acid washing and precise filtration are combined, whereby metal components that have a low solubility in water and remain in the composition even after the acid treatment can be removed thorough a filter. Further, putting the composition into a container made of an organic resin can prevent the risk of elution of silicon components, thereby enabling the prevention of defect occurrence after dry etching.

Thus, when a composition for forming an organic film that is produced according to the method of the present invention is used as a composition for forming a resist under layer film to form a resist under layer film, pattern transfer can be performed without the occurrence of defects during dry etching. Accordingly, it is suitably used for, in particular, liquid immersion exposure, double patterning, organic solvent development, etc., in the multilayer resist method, and finally the yield in manufacturing a semiconductor apparatus can be improved.

DETAILED DESCRIPTION OF THE PREFERRED EMBODIMENTS

As described above, there has been a problem that defects occurs after dry etching because of metal impurities in the composition for forming an organic under layer film, which is one of the reasons of the reduction in yield in the process of manufacturing a semiconductor apparatus. Therefore, it is desired to develop a method for producing a composition for forming an organic film that can form an organic film in which defects after dry etching are reduced.

The present inventors have earnestly studied on the above-described problems, and consequently found that when a compound having an aromatic skeleton (hereinafter, also referred to as "aromatic compound") which is a raw material of an organic under layer film is washed by an acid, metal impurities in the aromatic compound can be reduced, and when after the acid washing, a composition solution containing the aromatic compound is prepared and filtered, and then put into a container made of an organic resin, elution of silicon components derived from the conventional container made of glass can be prevented, and thus defects after dry etching can be reduced, thereby bringing the present invention to completion. Further, the present inventors found that metal components in the aromatic compound, particularly silicon and iron, can be effectively removed by washing using specific acid, for example, hydrofluoric acid, hydrochloric acid, nitric acid, a mixture of hydrofluoric acid and nitric acid, or a mixture of hydrochloric acid and nitric acid, in appropriate combination.

That is, the present invention is directed to a method for producing a composition for forming an organic film, the composition being used in a process of manufacturing a semiconductor apparatus, the method comprising the steps of:

(1) washing a compound having an aromatic skeleton by an acid;

(2) preparing a composition solution containing the washed compound;

(3) filtering the prepared composition solution through a filter; and (4) putting the filtered composition solution into a container made of an organic resin.

Hereinafter, the present invention will be described in detail, but the present invention is not limited thereto.

In the method for producing a composition for forming an organic film of the present invention, the aromatic compound to be used as a raw material of the composition for forming an organic film preferably has an aromatic skeleton selected from benzene, fluorene, carbazole, naphthalene, and anthracene.

Examples of the aromatic compound used in the present invention include many organic under layer film materials commonly known, and in the present invention, a resin having, as a skeleton, a naphthalene structure, an acenaphthylene structure, a naphthol structure, a bisnaphthol structure, a biphenyl structure, a carbazole structure, a phenol structure, or a bisphenol structure is preferably used.

Illustrative examples of the naphthalene compound include a resin containing the following structure disclosed in Japanese Patent Laid-Open Publication No. 2012-001687 and No. 2012-077295.

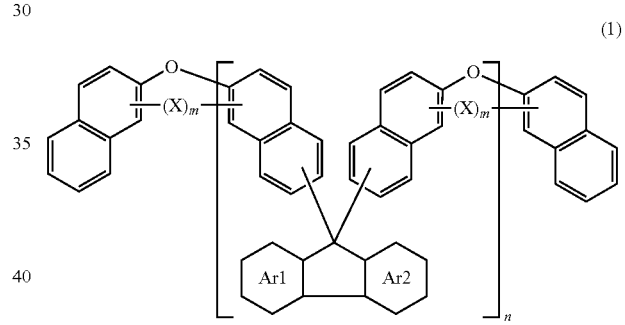

(1)

In the formula (1), cyclic structures Ar1 and Ar2 represent a benzene ring or a naphthalene ring; X represents a single bond or an alkylene group having 1 to 20 carbon atoms; "m" is 0 or 1; and "n" is such a natural number as to provide a molecular weight of 100,000 or less. The symbols are applied only to the above formula.

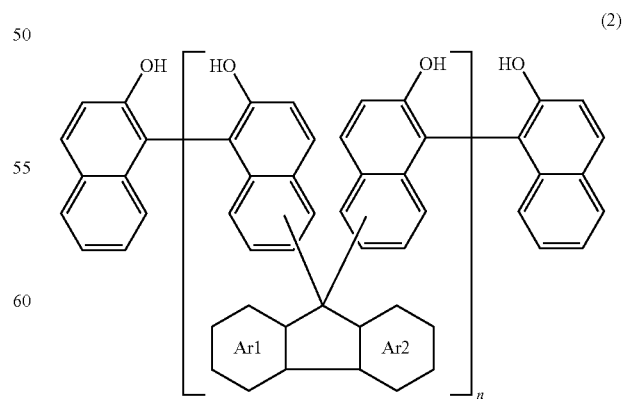

(2)

In the formula (2), cyclic structures Ar1 and Ar2 represent a benzene ring or a naphthalene ring; and "n" represents such a natural number as to provide a weight average molecular weight of 100,000 or less in terms of polystyrene by means of gel-permeation chromatography. The symbols are applied only to the above formula.

Illustrative examples of the acenaphthylene compound (and a compound having structure similar to acenaphthylene) include a resin containing the following structure disclosed in Japanese Patent Laid-Open Publication No. 2004-264710, No. 2005-043471, No. 2005-250434, No. 2007-293294, and No. 2008-65303.

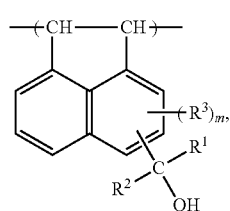

(3)

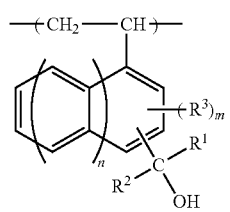

(4)

In the formulae (3) and (4), $R^1$ and $R^2$ represent a hydrogen atom, an alkyl group having 1 to 3 carbon atoms, or an aryl group; $R^3$ represents an alkyl group having 1 to 3 carbon atoms, a vinyl group, an allyl group, or an aryl group optionally substituted; "n" is 0 or 1; and "m" is 0, 1, or 2. The symbols are applied only to the above formulae.

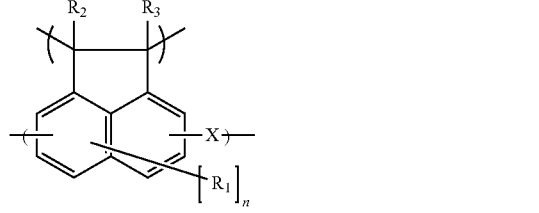

(5)

In the formula (5), $R_1$ represents a monovalent atom or group except for a hydrogen atom; "n" is an integer of 0 to 4, and when "n" is 2 to 4, each $R^1$ may be the same or different; $R_2$ and $R_3$ independently represent a monovalent atom or group; and X is a divalent group. The symbols are applied only to the above formula.

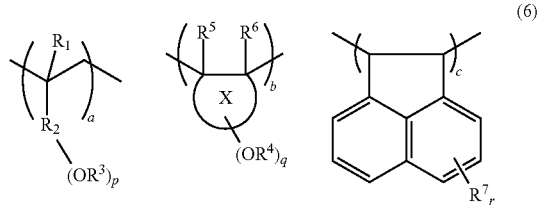

(6)

In the formula (6), $R_1$ represents a hydrogen atom or a methyl group; $R_2$ represents a single bond, a linear, branched, or cyclic alkylene group having 1 to 20 carbon atoms, an arylene group having 6 to 10 carbon atoms, and may include any of ether, ester, lactone, and amide; $R^3$ and $R^4$ independently represent a hydrogen atom or a glycidyl group; X represents a polymer of hydrocarbon having an indene skeleton, cycloolefin having 3 to 10 carbon atoms, or maleimide, and may include any of ether, ester, lactone, and carboxylic anhydride; $R^5$ and $R^6$ independently represent a hydrogen atom, a fluorine atom, a methyl group, or a trifluoromethyl group; $R^7$ represents a hydrogen atom, a linear, branched, or cyclic alkyl group having 1 to 6 carbon atoms, a hydroxyl group, or an alkoxycarbonyl group; "p" and "q" are each an integer of 1 to 4; "r" is an integer of 0 to 4; and "a", "b", and "c" are each a number in the range of $0.5 \leq a+b+c \leq 1$, $0 \leq a \leq 0.8$, $0 \leq b \leq 0.8$, $0.1 \leq a+b \leq 0.8$, $0.1 \leq c \leq 0.8$. The symbols are applied only to the above formula.

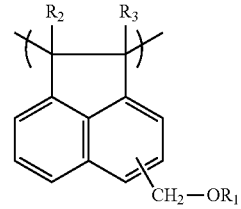

(7)

In the formula (7), $R_1$ represents a hydrogen atom or a monovalent organic group; and $R_2$ and $R_3$ each independently represent a monovalent atom or a monovalent organic group. The symbols are applied only to the above formula.

Illustrative examples of the naphthol compound include a resin containing the following structure disclosed in Japanese Patent Laid-Open Publication No. 2004-205685, No. 2007-171895, and No. 2009-014816.

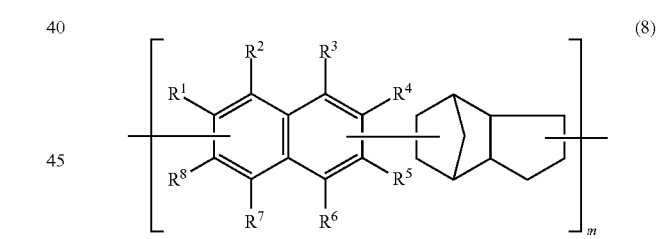

(8)

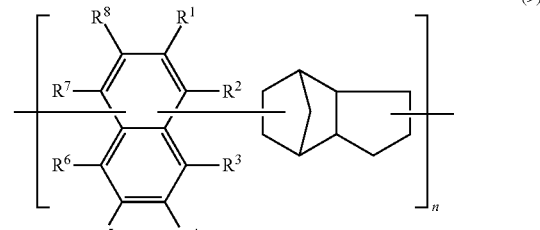

(9)

In the formulae (8) and (9), $R^1$ to $R^8$ each independently represent a hydrogen atom, a hydroxyl group, an alkyl group having 1 to 6 carbon atoms and optionally substituted, an alkoxy group having 1 to 6 carbon atoms and optionally substituted, an alkoxycarboxyl group having 2 to 6 carbon atoms and optionally substituted, an aryl group having 6 to 10 carbon atoms and optionally substituted, a hydroxyalkyl group having 1 to 6 carbon atoms, an isocyanate group, or a glycidyl group; and "m" and "n" are each a positive integer. The symbols are applied only to the above formulae.

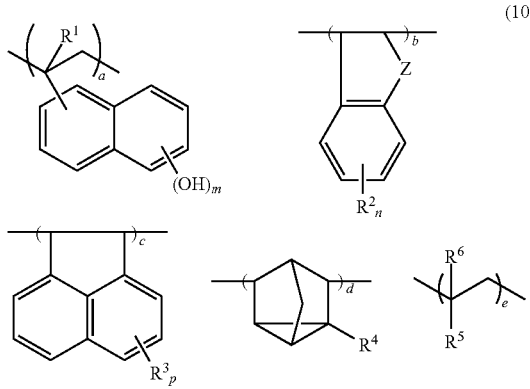

(10)

In the formula (10), $R^1$ and $R^6$ represent a hydrogen atom or a methyl group; $R^2$, $R^3$ and $R^4$ represent a hydrogen atom, an alkyl group having 1 to 4 carbon atoms, a hydroxyl group, an alkoxy group, an acetoxy group, an alkoxycarbonyl group, or an aryl group having 6 to 10 carbon atoms; $R^5$ represents a condensed polycyclic hydrocarbon group having 13 to 30 carbon atoms, $-O-R^7$, $-C(=O)-O-R^7$, $-O-C(=O)-R^7$, or $-C(=O)-NR^8-R^7$; "m" is 1 or 2; "n" is an integer of 0 to 4; "p" is an integer of 0 to 6; $R^7$ represents an organic group having 7 to 30 carbon atoms; $R^8$ represents a hydrogen atom or a hydrocarbon group having 1 to 6 carbon atoms; Z is a methylene group, $-O-$, $-S-$, or $-NH-$; and "a", "b", "c", "d", and "e" are each a number in the range of $0<a<1.0$, $0 \leq b \leq 0.8$, $0 \leq c \leq 0.8$, $0 \leq d \leq 0.8$, $0 \leq e \leq 0.8$, $0 \leq b+c+d+e<1.0$. The symbols are applied only to the above formula.

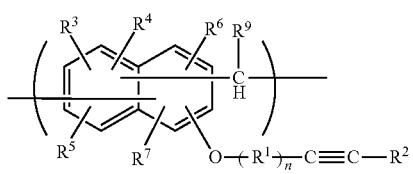

(11)

In the formula (11), "n" is 0 or 1; $R^1$ represents a methylene group optionally substituted, an alkylene group having 2 to 20 carbon atoms and optionally substituted, or an arylene group having 6 to 20 carbon atoms and optionally substituted; $R^2$ represents a hydrogen atom, an alkyl group having 1 to 20 carbon atoms and optionally substituted, or an aryl group having 6 to 20 carbon atoms and optionally substituted; $R^3$ to $R^7$ represent a hydroxyl group, an alkyl group having 1 to 6 carbon atoms and optionally substituted, an alkoxy group having 1 to 6 carbon atoms and optionally substituted, an alkoxycarbonyl group having 2 to 10 carbon atoms and optionally substituted, an aryl group having 6 to 14 carbon atoms and optionally substituted, or a glycidylether group having 2 to 6 carbon atoms and optionally substituted; and $R^9$ represents a hydrogen atom, a linear, branched, or cyclic alkyl group having 1 to 10 carbon atoms, a linear, branched, or cyclic alkylether group having 1 to 10 carbon atoms, or an aryl group having 6 to 10 carbon atoms. The symbols are applied only to the above formula.

Illustrative examples of the bisnaphthol compound include a resin containing the following structure disclosed in Japanese Patent Laid-Open Publication No. 2007-199653, No. 2008-274250, and No. 2010-122656.

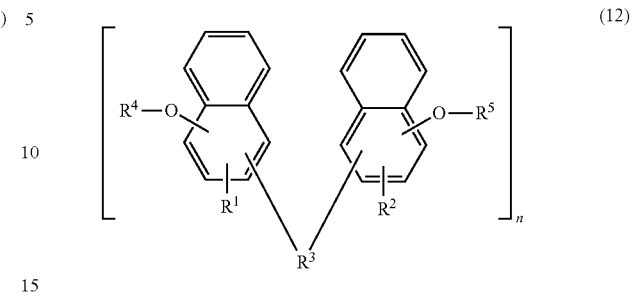

(12)

In the formula (12), $R^1$ and $R^2$ independently represent the same or different hydrogen atom, a linear, branched, or cyclic alkyl group having 1 to 10 carbon atoms, an aryl group having 6 to 10 carbon atoms, or an alkenyl group having 2 to 10 carbon atoms; $R^3$ represents a single bond or a linear, branched, or cyclic alkylene group having 1 to 30 carbon atoms, and may include a bridged cyclic hydrocarbon group, a double bond, a heteroatom, or an aromatic group having 6 to 30 carbon atoms; $R^4$ and $R^5$ each independently represent a hydrogen atom or a glycidyl group; and "n" is an integer of 1 to 4. The symbols are applied only to the above formula.

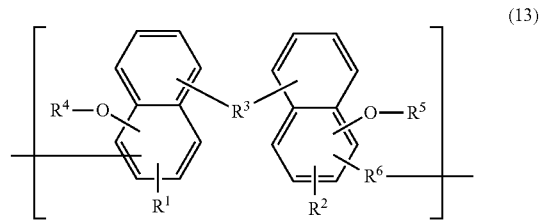

(13)

In the formula (13), $R^1$ and $R^2$ independently represent the same or different hydrogen atom, a linear, branched, or cyclic alkyl group having 1 to 10 carbon atoms, an aryl group having 6 to 10 carbon atoms, or an alkenyl group having 2 to 10 carbon atoms; $R^3$ represents a single bond or a linear, branched, or cyclic alkylene group having 1 to 30 carbon atoms, and may include a bridged cyclic hydrocarbon group, a double bond, a heteroatom, or an aromatic group having 6 to 30 carbon atoms; $R^4$ and $R^5$ each independently represent a hydrogen atom or a glycidyl group; and $R^6$ represents a single bond or a linear or branched alkylene group having 1 to 10 carbon atoms. The symbols are applied only to the above formula.

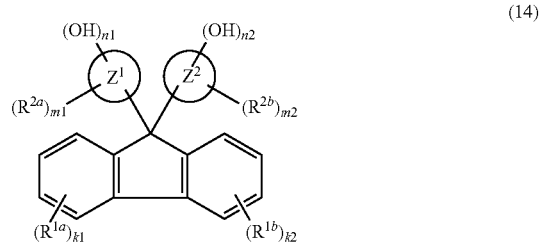

(14)

In the formula (14), ring $Z^1$ and ring $Z^2$ represent a condensed polycyclic aromatic hydrocarbon ring; $R^{1a}$, $R^{1b}$, $R^{2a}$, and $R^{2b}$ may be the same or different, and represent a substituent; k1 and k2 may be the same or different, and represent 0 or an integer of 1 to 4; m1 and m2 are each 0 or an integer of 1 or more; n1 and n2 each represent 0 or an integer of 1 or more, with the proviso that n1+n2≤1. The symbols are applied only to the above formula.

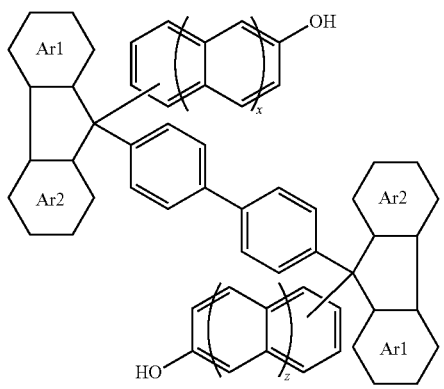

(15)

In the formula (15), $R^1$ and $R^2$ represent the same or different hydrogen atom, a linear, branched, or cyclic alkyl group having 1 to 10 carbon atoms, an aryl group having 6 to 10 carbon atoms, or an alkenyl group having 2 to 10 carbon atoms; $R^3$ and $R^4$ each represent a hydrogen atom or a glycidyl group; $R^5$ represents a single bond or a linear or branched alkylene group having 1 to 10 carbon atoms; $R^6$ and $R^7$ represent a benzene ring or a naphthalene ring; "p" and "q" are each 1 or 2; and "n" is 0<n≤1. The symbols are applied only to the above formula.

Illustrative examples of the biphenyl compound include a resin containing the following structure disclosed in Japanese Patent Laid-Open Publication No. 2012-214720.

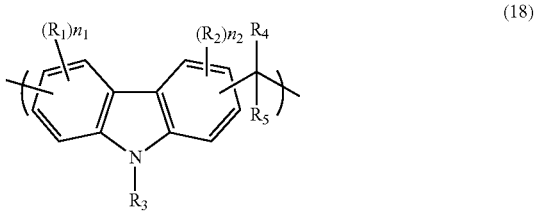

(16)

In the formula (16), cyclic structures Ar1 and Ar2 represent a benzene ring or a naphthalene ring; and "x" and "z" each independently represent 0 or 1. The symbols are applied only to the above formula.

Illustrative examples of the carbazole compound include a resin disclosed in Japanese Patent Laid-Open Publication No. 2014-029435, WO2012/077640, and WO2010/147155.

More specifically, a polymer containing the unit structure shown in the formula (17) disclosed in Japanese Patent Laid-Open Publication No. 2014-029435 may be mentioned.

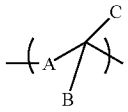

(17)

In the formula (17), A represents a structure having carbazole; B represents a structure having an aromatic ring; C represents a structure having a hydrogen atom, an alkyl group, or an aromatic ring; B and C may constitute a ring together; and a structure including A, B, and C has 1 to 4 carboxyl groups or salts thereof or carboxylate ester groups. The symbols are applied only to the above formula.

Also, there may be mentioned a polymer containing a unit structure of the formula (18) and a unit structure of the formula (19) in a proportion of 3 to 97:97 to 3 in a molar ration, as disclosed in WO2012/077640.

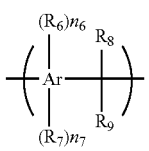

(18)

In the formula (18), $R_1$ and $R_2$ each independently represent a hydrogen atom, a halogen atom, a nitro group, an amino group, a hydroxyl group, an alkyl group having 1 to 10 carbon atoms, an alkenyl group having 2 to 10 carbon atoms, an aryl group having 6 to 40 carbon atoms, or a combination of these groups optionally including an ether bond, a ketone bond, or an ester bond; $R_3$ represents a hydrogen atom, an alkyl group having 1 to 10 carbon atoms, an alkenyl group having 2 to 10 carbon atoms, an aryl group having 6 to 40 carbon atoms, or a combination of these groups optionally including an ether bond, a ketone bond, or an ester bond; $R_4$ represents a hydrogen atom, or an aryl group having 6 to 40 carbon atoms or a heterocyclic group each of which may be substituted with a halogen atom, a nitro group, an amino group, or a hydroxyl group; $R_5$ represents a hydrogen atom, or an alkyl group having 1 to 10 carbon atoms, an aryl group having 6 to 40 carbon atoms, or a heterocyclic group each of which may be substituted with a halogen atom, a nitro group, an amino group, or a hydroxyl group; $R_4$ and $R_5$ may form a ring with each other; and n1 and n2 are each an integer of 1 to 3. The symbols are applied only to the above formula.

(19)

In the formula (19), Ar represents an aromatic ring group having 6 to 20 carbon atoms; $R_6$ represents a hydroxyl group; $R_7$ represents a hydrogen atom, a halogen atom, a nitro group, an amino group, an alkyl group having 1 to 10 carbon atoms, an alkenyl group having 2 to 10 carbon atoms, an aryl group having 6 to 40 carbon atoms, or a combination of these groups optionally including an ether bond, a ketone bond, or an ester bond; $R_8$ represents a hydrogen atom, an aryl group having 6 to 40 carbon atoms or a heterocyclic group each of which may be substituted with a halogen atom, a nitro group, an amino group, or a hydroxyl group; $R_9$ represents a hydrogen atom, or an alkyl group having 1 to 10 carbon atoms, an aryl group having 6 to 40 carbon atoms, or a heterocyclic group each of which may be substituted with a halogen atom, a nitro group, an amino group, or a hydroxyl group; $R_8$ and $R_9$ may form a ring with each other; n6 is an integer of 1 to p; and n7 is an integer of p-n6, where p is the maximum number of substituents with which the aromatic ring group Ar can be substituted. The symbols are applied only to the above formula.

Also, a polymer containing a unit structure shown in the formula (20) disclosed in WO2010/147155 may be mentioned.

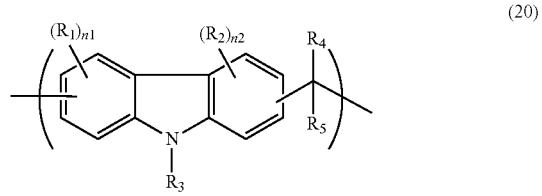

(20)

In the formula (20), $R_1$ and $R_2$ are each selected from a hydrogen atom, a halogen atom, a nitro group, an amino group, a hydroxyl group, an alkyl group having 1 to 10 carbon atoms, an alkenyl group having 2 to 10 carbon atoms, an aryl group having 6 to 40 carbon atoms, and a combination of these groups, and the alkyl group, the alkenyl group, and the aryl group may include an ether bond, a ketone bond, or an ester bond; $R_3$ is selected from a hydrogen atom, an alkyl group having 1 to 10 carbon atoms, an alkenyl group having 2 to 10 carbon atoms, an aryl group having 6 to 40 carbon atoms, and a combination of these groups, and the alkyl group, the alkenyl group, and the aryl group may include an ether bond, a ketone bond, or an ester bond; $R_4$ represents an aryl group having 6 to 40 carbon atoms or a heterocyclic group each of which may be substituted with a halogen atom, a nitro group, an amino group, or a hydroxyl group; $R_5$ represents a hydrogen atom, or an alkyl group having 1 to 10 carbon atoms, an aryl group having 6 to 40 carbon atoms, or a heterocyclic group each of which may be substituted with a halogen atom, a nitro group, an amino group, or a hydroxyl group; $R_4$ and $R_5$ may form a ring together with the carbon atom bonded thereto; and n1 and n2 are each an integer of 1 to 3. The symbols are applied only to the above formula.

Illustrative examples of the phenol compound include a novolac resin obtained by reaction between one or more phenols selected from phenol, cresol, xylenol, catechol, resorcinol, hydroquinone, pyrogallol, hydroxyquinol, phloroglucinol, etc., and one or more aldehyde sources selected from formaldehyde, paraformaldehyde, trioxane, etc., using an acidic catalyst; or a resin containing a repeating unit structure shown in the formula (21) disclosed in WO2012/176767.

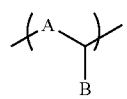

(21)

In the formula (21), A represents a phenylene group substituted with a hydroxyl group derived from polyhydroxybenzene; and B represents a monovalent condensed cyclic aromatic hydrocarbon group in which 2 to 6 benzene rings are condensed. The symbols are applied only to the above formula.

Illustrative examples of the bisphenol compound include a novolac resin having fluorene or tetrahydrospirobiindene structure that has a repeating unit structure shown in the formula (22-1) or (22-2) disclosed in Japanese Patent Laid-Open Publication No. 2005-128509, No. 2006-259249, No. 2006-259482, No. 2006-293298, and No. 2007-316282.

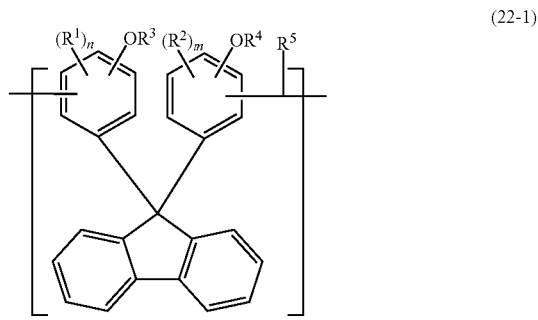

(22-1)

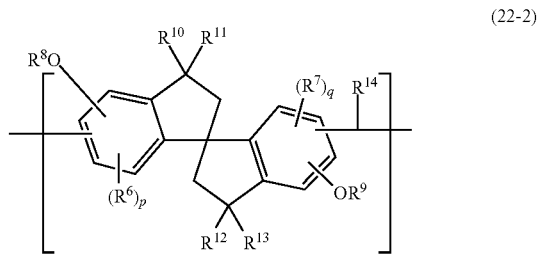

(22-2)

In the formulae (22-1) and (22-2), $R^1$, $R^2$, $R^6$, and $R^7$ independently represent a hydrogen atom, a linear, branched, or cyclic alkyl group having 1 to 10 carbon atoms, an aryl group having 6 to 10 carbon atoms, an allyl group, or a halogen atom; $R^3$, $R^4$, $R^8$, and $R^9$ independently represent a hydrogen atom, a linear, branched, or cyclic alkyl group having 1 to 6 carbon atoms, a linear, branched, or cyclic alkenyl group having 2 to 6 carbon atoms, an aryl group having 6 to 10 carbon atoms, or a glycidyl group; $R^5$ and $R^{14}$ independently represent a hydrogen atom, a linear, branched, or cyclic alkyl group having 1 to 10 carbon atoms, or an aryl group having 6 to 10 carbon atoms; "n", "m", "p", and "q" are each an integer of 1 to 3; and $R^{10}$ to $R^{13}$ independently represent a hydrogen atom, a halogen atom, a hydroxyl group, a linear, branched, or cyclic alkyl group having 1 to 6 carbon atoms, or a linear, branched, or cyclic alkoxy group having 1 to 6 carbon atoms. The symbols are applied only to the above formulae.

Moreover, the compound having the aromatic skeleton used in the method for producing a composition for forming an organic film of the present invention is preferably obtained by polymerization of a phenol derivative or a naphthol derivative or polymerization of a phenol derivative or a naphthol derivative and an aldehyde derivative.

Examples of the aforementioned compound having the aromatic skeleton include a reaction product obtained by the method disclosed in Japanese Patent Laid-Open Publication No. 2012-145897.

More specifically, there may be mentioned a polymer obtained by condensation of one or more compounds represented by either or both of the formulae (23-1) and (23-2) with one or more compounds represented by either or both of the formulae (24-1) and (24-2) and/or an equivalent thereof.

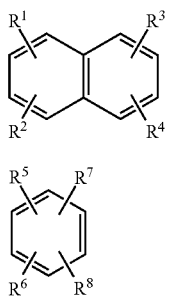

(23-1)

(23-2)

In the formulae (23-1) and (23-2), $R^1$ to $R^8$ independently represent a hydrogen atom, a halogen atom, a hydroxyl group, an isocyanato group, a glycidyloxy group, a carboxyl group, an amino group, an alkoxyl group having 1 to 30 carbon atoms, an alkoxycarbonyl group having 1 to 30 carbon atoms, and an alkanoyloxy group having 1 to 30 carbon atoms, or a saturated or unsaturated organic group having 1 to 30 carbon atoms and optionally substituted; and two substituents arbitrarily selected from each of $R^1$ to $R^4$ or $R^5$ to $R^8$ may be bonded each other to form a cyclic substituent in the molecule. The symbols are applied only to the above formulae.

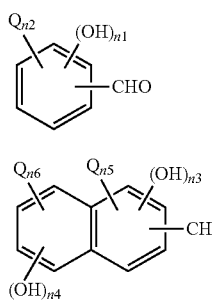

(24-1)

(24-2)

In the formulae (24-1) and (24-2), Q represents an organic group having 1 to 30 carbon atoms and optionally substituted, and two Q arbitrarily selected may be bonded each other to form a cyclic substituent in the molecule; and n1 to n6 are each 0, 1, or 2, which is the number of the respective substituents. In the formula (24-1), hydroxybenzaldehyde is excluded. Also, the formula (24-2) satisfies the relationships of $0 \leq n3+n \leq 3$, $0 \leq n4+n6 \leq 4$, $1 \leq n3+n4 \leq 4$. The symbols are applied only to the above formulae.

In addition, there may be mentioned a polymer obtained by condensation of one or more compounds represented by either or both of the formulae (23-1) and (23-2); one or more compounds represented by either or both of the formulae (24-1) and (24-2) and/or an equivalent thereof; and one or more compounds represented by the formula (25) and/or an equivalent thereof.

Y—CHO (25)

In the formula (25), Y represents a hydrogen atom or a monovalent organic group having 30 or less of carbons and optionally having a substituent, and the compound of formula (25) differs from the compounds of formulae (24-1) and (24-2). The symbols are applied only to the above formula.

Particularly, in the case of the multilayer resist method in which an organic film formed by using the composition for forming an organic film that contains the above-mentioned compound having an aromatic skeleton is used as an organic under layer film that will serves as an etching mask of the substrate to be processed, a formed resist pattern is transferred to a silicon-containing antireflective film, and then further transferred to the organic under layer film. Therefore, for the organic under layer film, the following properties are required: a property capable of being processed by etching under an etching condition where the silicon-containing antireflective film formed thereon exhibits high etching resistance; and properties of exhibiting high etching resistance and high wiggling resistance under an etching condition where the substrate to be processed placed thereunder is processed by etching.

The producing method of the present invention is suitably used for producing a composition for forming an organic film that contains the above-mentioned compound having the aromatic skeleton, but is not limited thereto. It may also be applied to a composition for forming an organic film that contains an aromatic compound other than the above-mentioned compounds.

Hereinafter, the method for producing a composition for forming an organic film of the present invention will be described in detail.

Metal impurities contained in the aromatic compound have two states: (A) a state capable of being removed by acid treatment for changing the metal impurities into water-soluble form, and (B) a state having low solubility in water even after the acid treatment, i.e. particulate state (colloidal state). In the present invention, (1) the aromatic compound is washed by an acid (acid washing step) to remove the metal impurities in state (A), then (2) a composition solution containing the washed compound is prepared, and (3) the prepared composition solution is filtered through a filter (precise filtration step) to remove the metal impurities in state (B). In this way, metal impurities in any state can be removed by the combination of acid washing and precise filtration.

Further, in the present invention, (4) the composition solution filtered as mentioned above is put into a container made of an organic resin to prevent elution of silicon derived from the container after the acid washing and precise filtration.

Hereinafter, the respective steps will be described in detail.

In the step (1), the aromatic compound is washed by an acid to change the metal impurities into water-soluble form and remove these. At this time, when the washing is performed with an acid solution containing a halogen acid one or more times, and with an acid solution containing nitric acid one or more times, the metal impurities such as silicon and iron can be effectively removed, in particular. Also, when the washing is performed with a mixed acid solution containing a halogen acid and nitric acid one or more times, the metal impurities such as silicon and iron can be effectively removed, in particular.

As the halogen acid used in this step, hydrofluoric acid and hydrochloric acid are preferred.

More specifically, in the present invention, it is preferred to wash the aromatic compound that will be used for a composition for forming an organic film, by combination of washing with an acid solution containing hydrofluoric acid and washing with an acid solution containing nitric acid; washing with an acid solution containing hydrochloric acid and washing with an acid solution containing nitric acid;

washing with a mixed acid solution containing hydrofluoric acid and nitric acid; washing with a mixed acid solution containing hydrochloric acid and nitric acid; washing with a mixed acid solution containing hydrofluoric acid and nitric acid and washing with an acid solution containing nitric acid; washing with a mixed acid solution containing hydrochloric acid and nitric acid and washing with an acid solution containing nitric acid; to reduce the content of the metal impurities such as silicon and iron. By washing with such acids, silicon components, particularly the silicon components contained as silica, and iron in the aromatic compound can be effectively removed.

As an exemplary procedure, there may be mentioned a method in which the aromatic compound is dissolved in an organic solvent that does not completely mix with acid to prepare a homogenous solution, then an acid is added thereto in a stirring vessel, followed by stirring, and the mixture solution is settled to separate and remove the acid. The organic solvent used in the procedure preferably has a low solubility in acid, and examples thereof include hydrocarbons such as benzene, toluene, and xylene; ethers such as diethyl ether and tetrahydrofuran; chlorinated solvents such as methylene chloride and chloroform; ketones such as 2-butanone, methylisobutyl ketone, and cyclohexanone; esters such as ethyl acetate, butyl acetate, propyleneglycolmonomethyl ether acetate (PGMEA), and ethyl lactate.

The concentrations of hydrofluoric acid, hydrochloric acid, and nitric acid used in the present invention may be 0.01 to 20% by mass, preferably 0.05 to 15% by mass, more preferably 0.1 to 10% by mass. In the mixed acid solution containing hydrofluoric acid and nitric acid, the ratio of hydrofluoric acid to nitric acid may be 1/100 to 100/1, preferably 1/10 to 10/1, and in the mixed acid solution containing hydrochloric acid and nitric acid, the ratio of hydrochloric acid to nitric acid may be 1/50 to 50/1, preferably 1/10 to 10/1, in terms of 100% in mass ratio.

The washing by acid is generally performed one or more times, preferably twice or more and 20 times or less. The more washing is performed, the more effectively metal impurities such as silicon and iron can be removed, but the number of washing as mentioned above is sufficient and economical since the production process is not extended. After the acid washing, the resultant is preferably further washed with deionized water to remove a residual acid. The deionize water preferably has an electrical conductivity of 0.1 microsiemens (µS/cm) or less, and water having an electrical conductivity of 0.07 microsiemens or less is more preferably used. At this time, an alkaline organic compound may also be added to facilitate the acid removal. Illustrative examples of the alkaline organic compound include amines and ammoniums, for example, trimethyl amine, butylamine, tetramethylammonium hydroxide, etc.

Also, in the present invention, the content of the metal impurities in the washed aromatic compound may be measured after the acid washing of the step (1).

In this measurement, the concentration of silicon atoms and iron atoms is preferably calculated by using an inductively coupled plasma mass spectrometer (ICP-MS) as a detector. When ICP-MS is used as the detector, the amount can be accurately calculated up to 0.1 ppt, so that it is suitably used for examining the content of the metal impurities in the aromatic compound after acid washing.

The content of silicon atoms in the aromatic compound after the acid washing is preferably 100 ppb or less. Also, the content of iron atoms is preferably 1 ppb or less.

If the content of silicon atoms is 100 ppb or less, defects after dry etching can be reduced. Further, if the content of iron atoms is 1 ppb or less, defects after dry etching hardly occurs.

In order to achieve the above-described contents of silicon atoms and iron atoms, not only the washing with hydrofluoric acid, hydrochloric acid, or nitric acid, but also the washing in combination thereof, e.g. the combination of washing with hydrofluoric acid and washing with nitric acid; washing with hydrochloric acid and washing with nitric acid; washing with a mixed acid solution containing hydrofluoric acid and nitric acid; washing with a mixed acid solution containing hydrochloric acid and nitric acid; washing with a mixed acid solution containing hydrofluoric acid and nitric acid and washing with nitric acid; or washing with a mixed acid solution containing hydrochloric acid and nitric acid and washing with nitric acid, is effective.

Next, in the step (2), a composition solution containing the washed compound is prepared. At his time, to prevent the elution of metal impurities to the compound after the acid washing, a container made of an organic resin is preferably used as the container with which the preparation is performed. Illustrative examples of the container include the same materials as used in the putting step described later.

Then, in the step (3), the prepared composition solution is filtered through a filter to remove the metal impurities in colloidal state, which cannot be removed by the acid washing, by precise filtration. The filter used in this step is preferably composed of a base material (i.e. a material constituting the filter) from which metal is not eluted. Examples thereof include nylon, polyethylene, polypropylene, polystyrene, and a fluorine resin. These base material may be used alone or in combination. Alternatively, a material in which the base materials are homogenized, i.e., a material having so-called polymer alloy structure, may be used.

Then, in the step (4), the composition solution thus filtered is put into a container made of an organic resin. Preferable examples of the container made of an organic resin include a container formed of a hydrocarbon based resin such as polyethylene and polypropylene; a polyester resin such as polyethylene terephthalate (PET) and polyethylene naphthalate (PEN) or; a fluorine resin such as perfluoroalkoxy fluorine resin (PFA), polytetrafluoroethylene (PTFE), ethylene-tetrafluoroethylene copolymer (ETFE). Besides, a container formed by laminating various resins may be used. Further, a container made of glass, metal, or resin which has an inner bag (inner container) composed of the above-mentioned resin may also be used as the organic resin container. That is, there is no limitation so long as a container directly contacting with the composition solution is made of an organic resin.

As described above, when the composition solution is put into the container made of glass conventionally used, silicon components are eluted from the container, which causes the defects after dry etching. By contrast, in the present invention, the composition solution is put into the container made of an organic resin as mentioned above, whereby the elution of silicon components from the conventional container can be prevented, and as a result, a composition for forming an organic film in which defects after etching does not occur can be produced.

Thus, when the method for producing a composition for forming an organic film of the present invention is employed, a composition for forming an organic film in which fewer metal is contained as impurities than that obtained by the conventional method can be produced.

Moreover, since the composition for forming an organic film thus produced is lowered in defects after etching, it is suitably used for liquid immersion exposure, double patterning, organic solvent development, etc., and the yield in manufacturing a semiconductor apparatus can be improved.

EXAMPLES

Hereinafter, the present invention will be specifically described with reference to Synthesis Examples, Comparative Synthesis Example, Examples, and Comparative Examples, but the present invention is not limited thereto.

Herein, as molecular weight, weight average molecular weight (Mw) and number average molecular weight (Mn) in terms of polystyrene were measured by gel-permeation chromatography (GPC), and dispersity (Mw/Mn) was calculated therefrom.

Synthesis of Aromatic Compound

Synthesis Example 1

Into 1,000 mL flask were placed 160.2 g of 1,5-dihydroxynaphtalene (1.00 mol), 56.8 g of a 37% formaldehyde solution (equivalent to 0.70 mol of formaldehyde), and 320 g of methyl cellosolve, and thereto was added 20 g of a methyl cellosolve solution containing 20% by mass of p-toluenesulfonic acid under stirring at 70° C. The temperature was increased to 85° C., and the mixture was stirred for 6 hours. Then, the mixture was cooled to room temperature, and diluted with 350 mL of methylisobutyl ketone. The diluted solution was transferred to a separatory funnel, and washed with 200 mL of deionized water to remove the p-toluenesulfonic acid served as a reaction catalyst. Then, acid washing and washing with deionized water were performed according to conditions described in Table 1. After the resulting solution was concentrated under reduced pressure, 400 mL of ethyl acetate was added to the residue, and a polymer was precipitated by 2,400 mL of hexane. The precipitated polymer was collected by filtration and dried under reduced pressure to obtain Polymer 1.

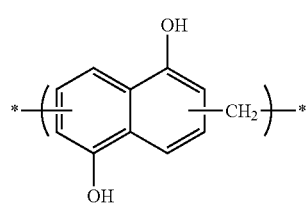

Polymer 1

The molecular weight (Mw) and the dispersity (Mw/Mn) were calculated in terms of polystyrene by gel-permeation chromatography (GPC).
Molecular weight (Mw)=4,200
Dispersity (Mw/Mn)=3.35

Synthesis Example 2

Into 1,000 mL flask were placed 80 g of 1,5-dihydroxynaphtalene (0.50 mol), 51.6 g of 2-hydroxy-6-naphthoaldehyde (0.30 mol), and 300 g of methyl cellosolve, and thereto was added 20 g of a methyl cellosolve solution containing 20% by mass of p-toluenesulfonic acid under stirring at 70° C. The temperature was increased to 85° C., and the mixture was stirred for 6 hours. Then, the mixture was cooled to room temperature, and diluted with 600 mL of methylisobutyl ketone. The diluted solution was transferred to a reparatory funnel, and washed with 200 mL of deionized water to remove the p-toluenesulfonic acid served as a reaction catalyst. Then, acid washing and washing with deionized water were performed according to conditions described in Table 1. After the resulting solution was concentrated under reduced pressure, 300 mL of ethyl acetate was added to the residue, and a polymer was precipitated by 1,800 mL of hexane. The precipitated polymer was collected by filtration and dried under reduced pressure to obtain Polymer 2.

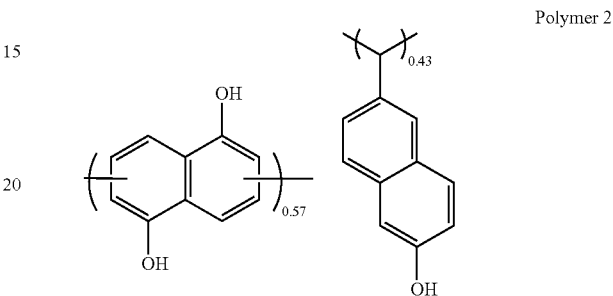

Polymer 2

The molecular weight (Mw) and the dispersity (Mw/Mn) were calculated in terms of polystyrene by gel-permeation chromatography (GPC).
Molecular weight (Mw)=3,500
Dispersity (Mw/Mn)=2.54

Synthesis Example 3

Into 300 mL flask were placed 144.2 g of 1-naphthol (1.0 mol) and 0.01 g of trifluoromethane-sulfonic acid, and thereto was added dropwise 79.3 g of dicyclopentadiene (0.6 mol) over 1 hour under stirring at 50° C. The mixture was stirred for 1 hours at the same temperature, then heated at 150° C., and stirred for 2 hours to bring the reaction to completion. After unreacted product was removed by distillation under reduced pressure, the reaction product was dissolved in 200 g of 1,2-dichloroethane, and acid washing and washing with deionized water were performed according to conditions described in Table 1. Then, 1,2-dichloroethane was removed under reduced pressure to obtain Polymer 3.

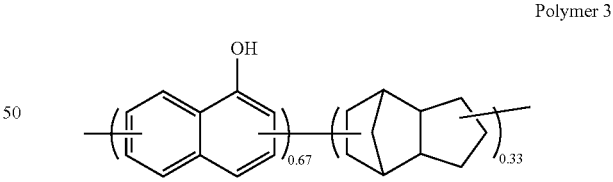

Polymer 3

The molecular weight (Mw) and the dispersity (Mw/Mn) were calculated in terms of polystyrene by gel-permeation chromatography (GPC).
Molecular weight (Mw)=1,100
Dispersity (Mw/Mn)=2.86

Synthesis Example 4

Into 1,000 mL flask were placed 225.3 g of 9,9-bis[6-(2-hydroxynaphthyl)]fluorene (0.50 mol), 28.4 g of a 37% formaldehyde solution (equivalent to 0.35 mol of formaldehyde), and 500 g of methyl cellosolve, and thereto was added 20 g of a methyl cellosolve solution containing 20% by mass of p-toluenesulfonic acid under stirring at 80° C. The temperature was increased to 120° C., and the mixture was stirred for 6 hours. Then, the mixture was cooled to room temperature, and diluted with 1,000 mL of methylisobutyl ketone. The diluted solution was transferred to a separatory funnel, and washed with 200 mL of deionized water to remove the p-toluenesulfonic acid served as a reaction catalyst. Then, acid washing and washing with deionized water were performed according to conditions described in Table 1. After the resulting solution was concentrated under reduced pressure, 400 mL of ethyl acetate was added to the residue, and a polymer was precipitated by 2,400 mL of hexane. The precipitated polymer was collected by filtration and dried under reduced pressure to obtain Polymer 4.

Polymer 4

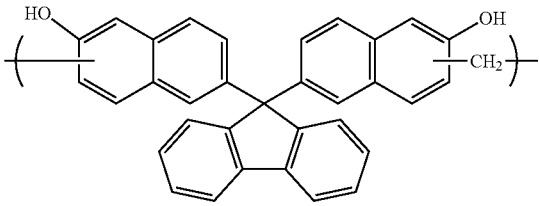

The molecular weight (Mw) and the dispersity (Mw/Mn) were calculated in terms of polystyrene by gel-permeation chromatography (GPC).
Molecular weight (Mw)=4,300
Dispersity (Mw/Mn)=4.30

Synthesis Example 5

Into 1,000 mL flask were placed 175.2 g of 9,9-bis(4-hydroxyphenyl)]fluorene (0.50 mol), 45.8 g of 4-hydroxybenzaldehyde (0.38 mol), and 450 g of 1-methoxypropanol, and thereto was added 20 g of a 1-methoxypropanol solution containing 20% by mass of p-toluenesulfonic acid under stirring at 80° C. The temperature was increased to 130° C., and the mixture was stirred for 12 hours. Then, the mixture was cooled to room temperature, and diluted with 900 mL of methylisobutyl ketone. The diluted solution was transferred to a separatory funnel, and washed with 200 mL of deionized water to remove the p-toluenesulfonic acid served as a reaction catalyst. Then, acid washing and washing with deionized water were performed according to conditions described in Table 1. After the resulting solution was concentrated under reduced pressure, 450 mL of ethyl acetate was added to the residue, and a polymer was precipitated by 2,700 mL of hexane. The precipitated polymer was collected by filtration and dried under reduced pressure to obtain Polymer 5.

Polymer 5

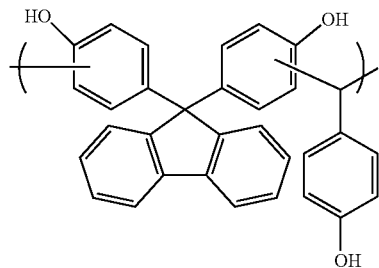

The molecular weight (Mw) and the dispersity (Mw/Mn) were calculated in terms of polystyrene by gel-permeation chromatography (GPC).
Molecular weight (Mw)=4,200
Dispersity (Mw/Mn)=3.34

Synthesis Example 6

Into 1,000 mL flask were placed 30.0 g of 2,2'-dinaphthyl ether (0.11 mol), 20.0 g of 9-fluorenone (0.11 mol), and 120 g of 1,2-dichloroethane, and thereto were added dropwise 0.6 mL of 3-mercaptopropionic acid and 6.0 mL of methanesulfonic acid under stirring at 70° C. The temperature was increased, and the reaction was performed for 13 hours under reflux. Then, the mixture was cooled to room temperature, and diluted with 500 mL of methylisobutyl ketone. The diluted solution was transferred to a separatory funnel, and washed with 100 mL of deionized water to remove the acid catalyst. Then, acid washing and washing with deionized water were performed according to conditions described in Table 1. After the resulting solution was concentrated under reduced pressure, 250 mL of tetrahydrofuran (THF) was added to the residue, and a polymer was precipitated by 1,500 mL of methanol. The precipitated polymer was collected by filtration and dried under reduced pressure to obtain Polymer 6.

Polymer 6

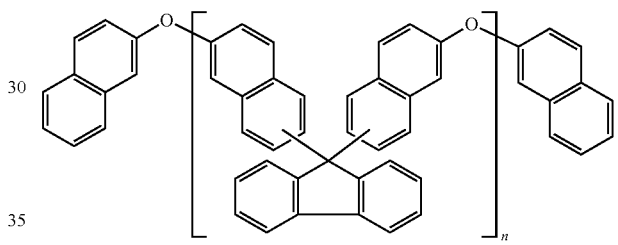

The molecular weight (Mw) and the dispersity (Mw/Mn) were calculated in terms of polystyrene by gel-permeation chromatography (GPC).
Molecular weight (Mw)=3,100
Dispersity (Mw/Mn)=2.10

Synthesis Example 7

Into 1,000 mL flask were placed 100 g of carbazole (598 mmol), 64.1 g of benzaldehyde (604 mmol), and 11.9 g of p-toluenesulfonic acid monohydride (62.6 mmol). Thereto, 150 g of 1,4-dioxane was further added, and heated at 100° C. under stirring to perform the polymerization reaction for 2 hours. After completion of the reaction, the reaction product was cooled to 60° C., and diluted with 500 mL of methylisobutyl ketone. The diluted solution was transferred to a reparatory funnel, and washed with 200 mL of deionized water to remove the p-toluenesulfonic acid served as a reaction catalyst. Then, acid washing and washing with deionized water were performed according to conditions described in Table 1. After the resulting solution was concentrated under reduced pressure, 450 mL of chloroform was added to the residue, and a polymer was precipitated by 2,500 mL of methanol. The precipitated polymer was collected by filtration and dried under reduced pressure to obtain Polymer 7.

Polymer 7

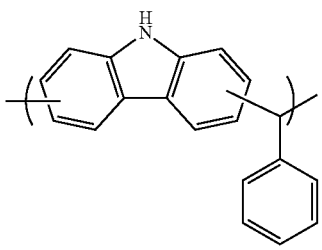

The molecular weight (Mw) and the dispersity (Mw/Mn) were calculated in terms of polystyrene by gel-permeation chromatography (GPC).
Molecular weight (Mw)=4,200
Dispersity (Mw/Mn)=1.75

Synthesis Example 8

Polymer was synthesized in the same manner as in Synthesis Example 1, and p-toluenesulfonic acid was removed therefrom. Then, acid washing and washing with deionized water were performed according to the condition of Synthesis Example 8 in Table 1. After the resulting solution was concentrated under reduced pressure, 400 mL of ethyl acetate was added to the residue, and a polymer was precipitated by 2,400 mL of hexane. The precipitated polymer was collected by filtration and dried under reduced pressure to obtain Polymer 1A.

Polymer 1A

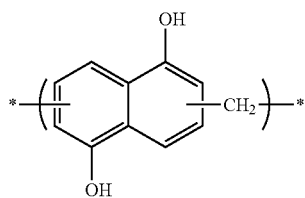

The molecular weight (Mw) and the dispersity (Mw/Mn) were calculated in terms of polystyrene by gel-permeation chromatography (GPC).
Molecular weight (Mw)=4,100
Dispersity (Mw/Mn)=3.30

Synthesis Example 9

Polymer was synthesized in the same manner as in Synthesis Example 1, and p-toluenesulfonic acid was removed therefrom. Then, acid washing and washing with deionized water were performed according to the condition of Synthesis Example 9 in Table 1. After the resulting solution was concentrated under reduced pressure, 400 mL of ethyl acetate was added to the residue, and a polymer was precipitated by 2,400 mL of hexane. The precipitated polymer was collected by filtration and dried under reduced pressure to obtain Polymer 1B.

Polymer 1B

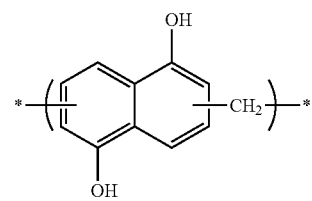

The molecular weight (Mw) and the dispersity (Mw/Mn) were calculated in terms of polystyrene by gel-permeation chromatography (GPC).
Molecular weight (Mw)=4,200
Dispersity (Mw/Mn)=3.40

Comparative Synthesis Example 1

Polymer was synthesized in the same manner as in Synthesis Example 1, and p-toluenesulfonic acid was removed therefrom. Then, as shown in Table 1, acid washing was not performed, and only washing with deionized water was carried out. After the resulting solution was concentrated under reduced pressure, 400 mL of ethyl acetate was added to the residue, and a polymer was precipitated by 2,400 mL of hexane. The precipitated polymer was collected by filtration and dried under reduced pressure to obtain Polymer 1C.

Polymer 1C

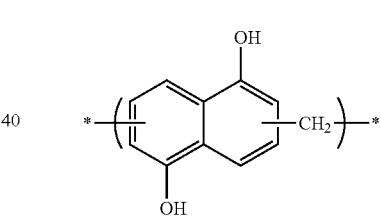

The molecular weight (Mw) and the dispersity (Mw/Mn) were calculated in terms of polystyrene by gel-permeation chromatography (GPC).
Molecular weight (Mw)=4,100
Dispersity (Mw/Mn)=3.30

With respect to Polymers 1 to 7 and 1A to 1C obtained by synthesizing and washing as mentioned above, the contents of silicon atoms and iron atoms in the aromatic compound (polymer) were measured with ICP-MS manufactured by Agilent Technologies, Inc. The results are shown in Table 1.

TABLE 1

| Example | Acid washing | | | Deionized water washing | | Metal content in |
| | Acid | Amount | Number of times | Amount | Number of times | Aromatic compound |
|---|---|---|---|---|---|---|
| Synthesis Example 1 | 3% hydrofluoric acid 10% nitric acid | 150 mL 150 mL | 1 1 | 150 mL | 10 | Si: 2 ppb Fe: 0.5 ppb |
| Synthesis Example 2 | 5% hydrochloric acid 5% nitric acid | 150 mL 150 mL | 2 2 | 150 mL | 5 | Si: 20 ppb Fe: 0.7 ppb |

TABLE 1-continued

| Example | Acid washing | | | Deionized water washing | | Metal content in Aromatic compound |
|---|---|---|---|---|---|---|
| | Acid | Amount | Number of times | Amount | Number of times | |
| Synthesis Example 3 | Mixture of 50 mL of 3% hydrofluoric acid + 100 mL of 10% nitric acid | 150 mL | 2 | 150 mL | 10 | Si: 1 ppb<br>Fe: 0.5 ppb |
| Synthesis Example 4 | Mixture of 100 mL of 10% hydrochloric acid + 30 mL of 10% nitric acid | 130 mL | 2 | 150 mL | 10 | Si: 10 ppb<br>Fe: 0.8 ppb |
| Synthesis Example 5 | Mixture of 50 mL of 3% hydrofluoric acid + 100 mL of 10% nitric acid; 5% nitric acid | 150 mL<br>150 mL | 1<br>1 | 150 mL | 10 | Si: 3 ppb<br>Fe: 0.5 ppb |
| Synthesis Example 6 | Mixture of 100 mL of 5% hydrochloric acid + 50 mL of 10% nitric acid; 5% nitric acid | 150 mL<br>150 mL | 1<br>1 | 150 mL | 10 | Si: 12 ppb<br>Fe: 0.5 ppb |
| Synthesis Example 7 | Mixture of 100 mL of 10% hydrochloric acid + 50 mL of 10% nitric acid; 5% nitric acid | 150 mL<br>150 mL | 1<br>1 | 150 mL | 10 | Si: 8 ppb<br>Fe: 0.4 ppb |
| Synthesis Example 8 | 3% hydrofluoric acid | 150 mL | 1 | 150 mL | 10 | Si: 5 ppb<br>Fe: 1.5 ppb |
| Synthesis Example 9 | 5% nitric acid | 150 mL | 2 | 150 mL | 5 | Si: 120 ppb<br>Fe: 0.9 ppb |
| Comparative Synthesis Example 1 | none (water) | 150 mL | 2 | 150 mL | 10 | Si: 200 ppb<br>Fe: 50 ppb |

Examples and Comparative Examples (Production of Composition Solution (SOL-1 to 10))

Into a 200 mL bottle made of polyethylene that has been washed with 1% hydrofluoric acid three times, 20 g of Polymer 1 to 7, 1A, 1B, or 1C obtained in Synthesis Example, 1 g of acid generator AG1 shown below, 4 g of crosslinking agent CR1 shown below, 100 g of propyleneglycolmonomethyl ether acetate containing 0.1% by mass of FC-430 (available from Sumitomo 3M Inc.) were mixed and sufficiently stirred with a magnetic stirrer to homogenize and prepare respective composition solutions. Then, the prepared composition solutions were each filtered through 0.1 μm of a filter made of fluorine resin, thereby producing Composition solutions (SOL-1 to 10). The obtained composition solutions were put into a bottle made of polyethylene, respectively.

(Production of Composition Solution (SOL-1X))

Using a commercially available 200 mL-bottle made of brown glass and Polymer 1, Composition solution (SOL-1X) was produced in the same manner as mentioned above. The obtained composition solution was put into a bottle made of brown glass.

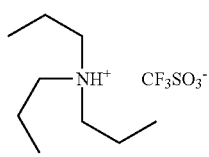

AG1

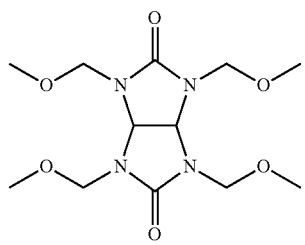

CR1

(Patterning Test)

SOL-1 to 10, and 1X were each applied onto a silicon wafer formed with a thermal oxide film with a film thickness of 100 nm, and baked at 350° C. for 60 seconds to form an organic under layer film (S-1 to 10, and 1X) with a film thickness of 200 nm. Then, silicon-containing resist under layer film material (SOG1) shown below was applied thereto, and baked 240° C. for 60 seconds to form a silicon-containing film with a film thickness of 35 nm. Subsequently, ArF resist solution for positive development (PR-1) shown in Table 2 was applied and baked at 110° C. for 60 seconds to form a photoresist film with a film thickness of 100 nm. Further, liquid immersion top coat material (TC-1) shown in Table 3 was applied thereto and baked at 90° C. for 60 seconds to form a top coat with a film thickness of 50 nm.

SOG1

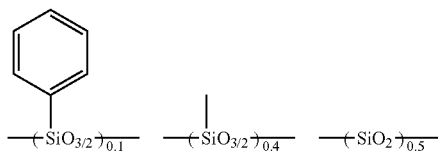

Molecular weight (Mw)=3,000

TABLE 2

| No. | Polymer (parts by mass) | Acid generator (parts by mass) | Base (parts by mass) | Solvent (parts by mass) |
|---|---|---|---|---|
| PR-1 | ArF resist polymer 1 (100) | PAG1 (7.0) | Quencher (1.0) | PGMEA (2,500) |

ArF resist polymer 1

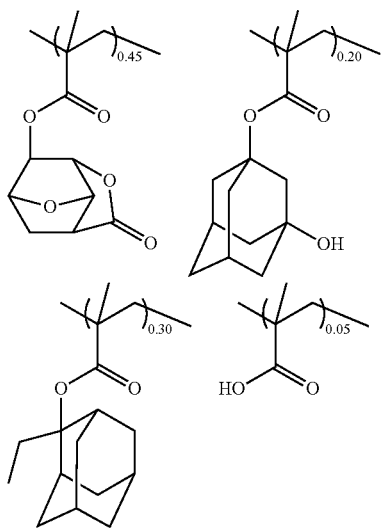

Molecular weight (Mw)=7,800
Dispersity (Mw/Mn)=1.78

Acid Generator:

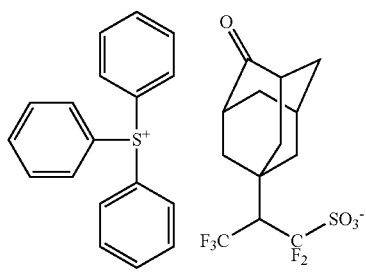

PAG1

Base:

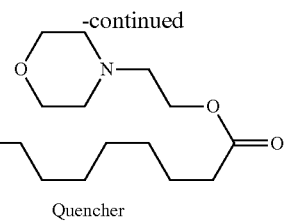

Quencher

TABLE 3

| | Polymer (parts by mass) | Organic solvent (parts by mass) |
|---|---|---|
| TC-1 | Top coat polymer (100) | diisoamyl ether (2700) 2-methyl-1-butanol (270) |

Top Coat Polymer:

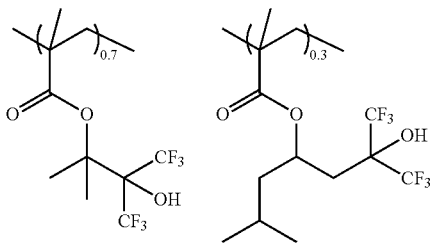

Molecular weight (Mw)=8,800
Dispersity (Mw/Mn)=1.69

Next, these were exposed by an ArF liquid immersion exposure apparatus (NSR-S610C manufactured by Nikon Corporation, NA: 1.30, σ: 0.98/0.65, 35° polarized dipole illumination, 6% halftone phase shift mask), baked at 100° C. for 60 seconds (PEB), and developed by a 2.38% by mass tetramethylammonium hydroxide (TMAH) aqueous solution for 30 seconds to obtain 43 nm 1:1 positive line and space pattern.

Pattern collapse was examined by an electron microscope (CG4000) manufactured by Hitachi High-Technologies Corporation, and a cross-sectional shape of the pattern was observed by an electron microscope (S-4700) manufactured by Hitachi, Ltd. The results are shown in Table 4.

TABLE 4

| Examples | Polymer | Composition solution | Organic under layer film | Cross-sectional pattern shape after development | Pattern collapse |
|---|---|---|---|---|---|
| Example 1 | 1 | SOL-1 | S-1 | Vertical shape | None |
| Example 2 | 2 | SOL-2 | S-2 | Vertical shape | None |
| Example 3 | 3 | SOL-3 | S-3 | Vertical shape | None |
| Example 4 | 4 | SOL-4 | S-4 | Vertical shape | None |
| Example 5 | 5 | SOL-5 | S-5 | Vertical shape | None |
| Example 6 | 6 | SOL-6 | S-6 | Vertical shape | None |
| Example 7 | 7 | SOL-7 | S-7 | Vertical shape | None |
| Example 8 | 1A | SOL-8 | S-8 | Vertical shape | None |
| Example 9 | 1B | SOL-9 | S-9 | Vertical shape | None |
| Comparative Example 1 | 1C | SOL-10 | S-10 | Vertical shape | None |
| Comparative Example 2 | 1 | SOL-1X | S-1X | Vertical shape | None |

As shown in Table 4, problem was not found in cross sectional pattern shape and pattern collapse at the time of forming a resist patter in the photoresist film in any cases of Examples 1 to 9, in which acid washing was performed and after preparation and filtration, the composition solution was put into a bottle made of polyethylene, Comparative example 1, in which acid washing was not performed, and Comparative example 2, in which after filtration, the composition solution was put into a bottle made of glass.

(Pattern Etching Test)

The resist pattern formed by the patterning test was used as a mask, and the pattern was transferred by dry etching. The pattern was transferred to the silicon-containing film by dry etching under the etching condition (1), then the pattern was transferred to the organic under layer film by dry etching under the etching condition (2), and further the pattern was transferred to the thermal oxide film by dry etching under the etching condition (3). The cross sectional shapes of the obtained patterns were observed by an electron microscope (S-9380) manufactured by Hitachi, Ltd., and pattern defects were examined by a bright-field defect detecting apparatus KLA2800 manufactured by KLA-Tencor Corporation. The results are shown in Table 5.

(1) Etching conditions in $CHF_3/CF_4$ type gas Device: Dry etching device Telius SP manufactured by Tokyo Electron Limited Etching conditions (1):

| | |
|---|---|
| Chamber pressure | 15 Pa |
| Upper/Lower RF power | 500 W/300 W |
| $CHF_3$ gas flow rate | 50 mL/min |
| $CF_4$ gas flow rate | 150 mL/min |
| Treatment time | 40 sec |

(2) Etching conditions in $CO_2/N_2$ type gas
Device: Dry etching device Telius SP manufactured by Tokyo Electron Limited
Etching conditions (2):

| | |
|---|---|
| Chamber pressure | 2 Pa |
| Upper/Lower RF power | 1000 W/300 W |
| $CO_2$ gas flow rate | 320 mL/min |
| $N_2$ gas flow rate | 80 mL/min |
| Treatment time | 30 sec |

(3) Etching conditions in $CHF_3/CF_4$ type gas
Device: Dry etching device Telius SP manufactured by Tokyo Electron Limited
Etching conditions (3):

| | |
|---|---|
| Chamber pressure | 20 Pa |
| Upper/Lower RF power | 500 W/300 W |
| $CHF_3$ gas flow rate | 30 mL/min |
| $CF_4$ gas flow rate | 170 mL/min |
| Treatment time | 40 sec |

TABLE 5

| Examples | Cross-sectional shape of Thermal oxide film | Number of defects |
|---|---|---|
| Example 1 | Vertical shape | 11 |
| Example 2 | Vertical shape | 12 |
| Example 3 | Vertical shape | 10 |
| Example 4 | Vertical shape | 9 |
| Example 5 | Vertical shape | 10 |
| Example 6 | Vertical shape | 11 |
| Example 7 | Vertical shape | 10 |
| Example 8 | Vertical shape | 18 |
| Example 9 | Vertical shape | 20 |
| Comparative Example 1 | Vertical shape | 57 |
| Comparative Example 2 | Vertical shape | 52 |

As shown in Table 5, compared with Comparative Example 1, in which acid washing was not performed, Examples 1 to 9, in which acid washing was performed, resulted in the reduction in etching defects. Also, compared with Comparative Example 2 using a container made of glass for putting the composition solution, Example 1 using a container made of polyethylene demonstrated that etching defects were reduced. Further, as understood from the results of Examples 1 to 7, it was revealed that when the washing is performed by using hydrofluoric acid, hydrochloric acid, nitric acid, a mixture of hydrofluoric acid and nitric acid, or a mixture of hydrochloric acid and nitric acid in appropriate combination, metal impurities can be more effectively removed, and thus defects after etching can be reduced.

From the results mentioned above, it was revealed that the method for producing a composition for forming an organic film of the present invention can produce a composition for forming an organic film that can form an organic film in which defects occurring after dry etching are reduced.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A method for producing a composition for forming an organic film, the composition being used in a process of manufacturing a semiconductor apparatus, the method comprising the steps of:
   (1) washing a compound having an aromatic skeleton by an acid;
   (2) preparing a composition solution containing the washed compound;
   (3) filtering the prepared composition solution through a filter; and
   (4) putting the filtered composition solution into a container made of an organic resin,
   wherein the step of washing includes washing with an acid solution containing a halogen acid one or more times, and washing with an acid solution containing nitric acid one or more times, and
   wherein the halogen acid is hydrofluoric acid or hydrochloric acid.

2. The method for producing a composition for forming an organic film according to claim 1, wherein the aromatic skeleton is any of benzene, fluorene, carbazole, naphthalene, and anthracene.

3. The method for producing a composition for forming an organic film according to claim 2, wherein the compound having the aromatic skeleton is obtained by polymerization of at least a phenol derivative or a naphthol derivative.

4. The method for producing a composition for forming an organic film according to claim 2, wherein the step of washing includes washing with a mixed acid solution containing the halogen acid and nitric acid one or more times.

5. The method for producing a composition for forming an organic film according to claim 1, wherein the compound having the aromatic skeleton is obtained by polymerization of at least a phenol derivative or a naphthol derivative.

6. The method for producing a composition for forming an organic film according to claim 5, wherein the step of washing includes washing with a mixed acid solution containing the halogen acid and nitric acid one or more times.

7. The method for producing a composition for forming an organic film according to claim 1, wherein the compound having the aromatic skeleton is obtained by polymerization of a phenol derivative or a naphthol derivative and an aldehyde derivative.

8. The method for producing a composition for forming an organic film according to claim 1, wherein a content of silicon atoms in the washed compound is 100 ppb or less.

9. The method for producing a composition for forming an organic film according to claim 8, wherein the step of washing includes washing with a mixed acid solution containing the halogen acid and nitric acid one or more times.

10. The method for producing a composition for forming an organic film according to claim 1, wherein a content of iron atoms in the washed compound is 1 ppb or less.

11. The method for producing a composition for forming an organic film according to claim 10, wherein the step of washing includes washing with a mixed acid solution containing the halogen acid and nitric acid one or more times.

12. The method for producing a composition for forming an organic film according to claim 1, wherein the step of washing includes washing with a mixed acid solution containing the halogen acid and nitric acid one or more times.

13. The method for producing a composition for forming an organic film according to claim 1, wherein a base material of the filter comprises one or more materials selected from nylon, polyethylene, polypropylene, polystyrene, and a fluorine resin.

* * * * *